(12) United States Patent
Arkin et al.

(10) Patent No.: US 6,836,868 B1
(45) Date of Patent: Dec. 28, 2004

(54) HIGH-SPEED ALGORITHMIC PATTERN GENERATOR

(75) Inventors: Brian J. Arkin, Pleasanton, CA (US); Gary L. Schaps, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 682 days.

(21) Appl. No.: 09/704,369

(22) Filed: Oct. 31, 2000

(51) Int. Cl.[7] .......................... G01R 31/28; G06F 11/00
(52) U.S. Cl. ................................... 714/743; 714/715
(58) Field of Search ............................. 714/743, 738, 714/715, 728; 324/73.1

(56) References Cited

U.S. PATENT DOCUMENTS

| | | | | |
|---|---|---|---|---|
| 4,862,067 A | * | 8/1989 | Brune et al. ............... | 324/73.1 |
| 6,009,546 A | * | 12/1999 | Kuglin et al. ............... | 714/738 |
| 6,073,263 A | * | 6/2000 | Arkin et al. ................. | 714/738 |
| 6,092,225 A | * | 7/2000 | Gruodis et al. ............. | 714/724 |
| 6,286,120 B1 | * | 9/2001 | Reichert et al. ............ | 714/738 |
| 6,380,730 B1 | * | 4/2002 | Arkin et al. ............. | 324/158.1 |

* cited by examiner

Primary Examiner—Joseph D. Torres
(74) Attorney, Agent, or Firm—Daniel J. Bedell; Smith-Hill and Bedell

(57) ABSTRACT

An algorithmic pattern generator for generating an output vector on each pulse of a clock signal includes a vector memory for storing a vector and an accompanying repeat number at each of several addresses. On each of N consecutive clock signal pulses, a repeat processor appends an instance of a vector read out of the vector memory to the pattern generator's output vector sequence. An instruction processor causes the instruction memory to read out instructions and responds to each instruction by telling the instruction processor to signal the address counter to supply the starting address to the vector memory and to thereafter periodically increment the starting address for M consecutive clock signal cycles. When appending N instances of each vector to the pattern generator output sequence, the repeat processor inhibits the address counter from incrementing its output address for N−1 cock signal cycles.

18 Claims, 2 Drawing Sheets

Figure 5:
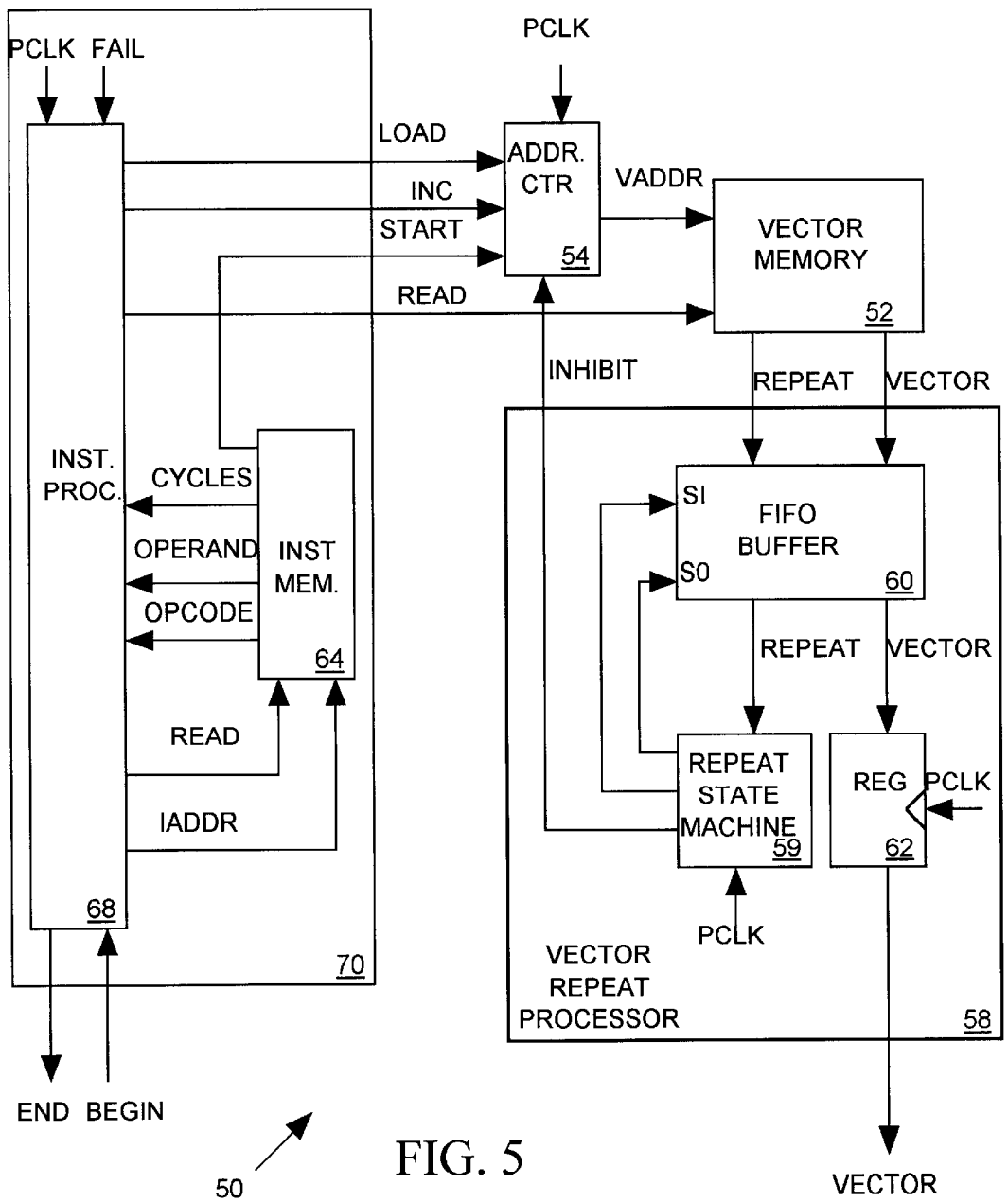

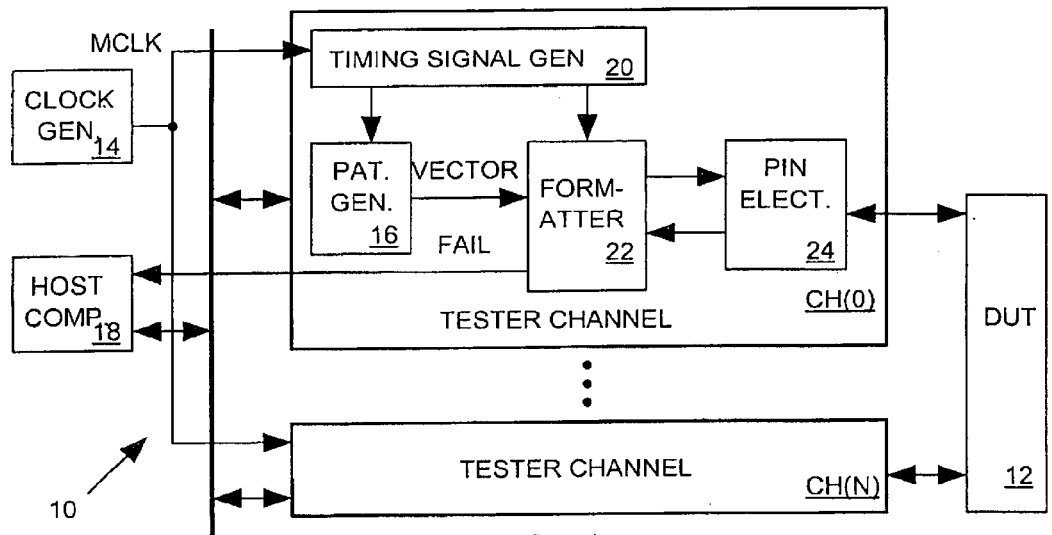
FIG. 1
(PRIOR ART)
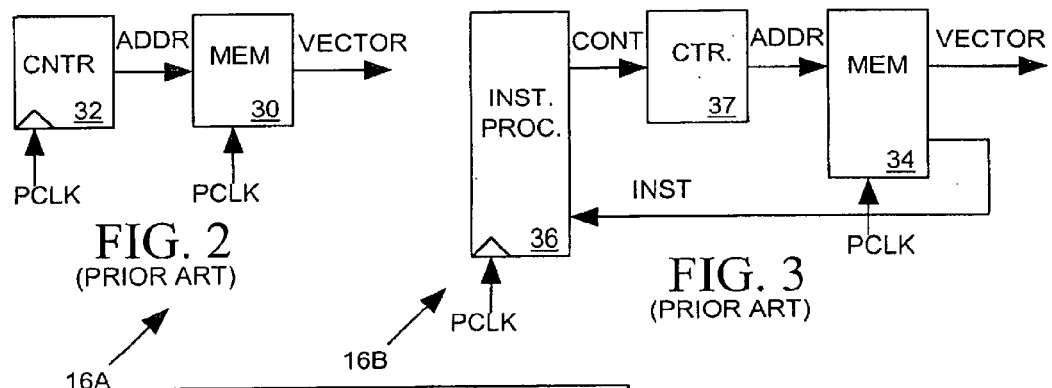
FIG. 2
(PRIOR ART)
FIG. 3
(PRIOR ART)
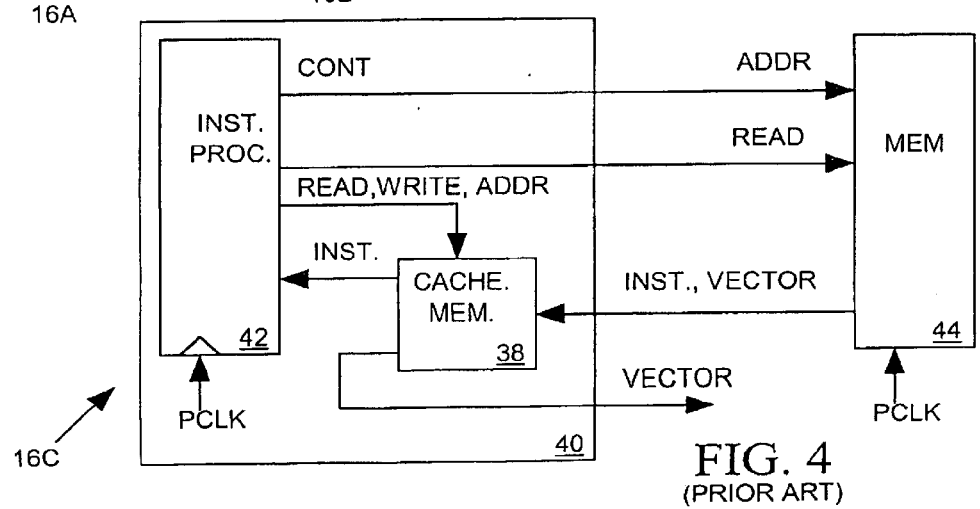
FIG. 4
(PRIOR ART)

HIGH-SPEED ALGORITHMIC PATTERN GENERATOR

BACKGROUND OF THE INVENTION

1. Field of the Invention

The present invention relates in general to an algorithmic a pattern generator for generating a vector sequence, and in particular to a high-speed algorithmic pattern employing separate vector and instruction memories.

2. Description of Related Art

A typical pattern generator (or vector generator) produces an output pattern data word (a "vector") on each pulse of a reference clock signal. Pattern generators are often employed in integrated circuit testers to produce vector sequences for controlling the behavior of the testers. FIG. 1 illustrates a typical prior art integrated circuit (IC) tester 10 including a set of N tester channels CH(0)–CH(N), each linked to a separate terminal of an integrated circuit device under test (DUT) 12. A test is organized into a succession of test cycles, and during each test cycle each channel CH(0) –CH(N) may transmit a test signal to a DUT terminal or sample a DUT output signal produced at that terminal to determine whether the DUT is behaving as expected. During the test, a central clock generator 14 supplies a master clock signal MCLK to all tester channels CH(0)–CH(N), and all channels synchronize their test activities to that master clock signal.

Tester channel CH(0), typical of the other tester channels, includes a pattern generator 16 programmed by a central host computer 18 to produce a vector prior to the start of each test cycle. A timing signal generator 20 supplies a "period" clock signal PCLK (derived from the MCLK signal) to pattern generator 16 marking the start of each test cycle telling the pattern generator when to generate a next vector. Each vector output of pattern generator 16 references a test activity that channel CH(0) is to carry out during the test cycle, such as changing the state of a test signal or sampling a DUT output signal. The vector may also reference a particular time during the test cycle at which the test activity is to occur. When the channel is to sample a DUT output signal, the vector will also indicate an expected state of the DUT output signal. The bit width of the vector limits the number of different combinations of test activities and timings that the vector is able to reference.

A formatter circuit 22 receives and decodes each vector to supply a set of control signals to a pin electronics circuit 24 for generating the test input to DUT 12 and samples DUT output signals. State changes in those control signals tell pin electronics circuit 24 how and when to change test signal states or when to sample the DUT output signal. The vector input from pattern generator 16 at the start of a test cycle tells formatter 22 when and how to change the states of the control signals supplied to pin electronics circuit 24, and formatter produces those control signal state changes using as timing references a set of timing signals TS supplied by timing signal generator 20. When pin electronics circuit 24 samples a DUT output signal, it determines the output signal's logic state, and transmits a signal back to formatter 22 indicating that logic state. Formatter 22 then compares the DUT output signal's logic state to an expected state referenced by the input vector for the current test cycle. When the expected and actual DUT output signal states fail to match, formatter 22 generates a FAIL signal and sends it back to host computer 18 to indicate that the DUT has failed the test.

FIG. 2 illustrates a simple prior art pattern generator 16A that has been used in the past to implement pattern generator 16 of FIG. 1. Before the start of a test, host computer 18 of FIG. 1 writes the vectors needed for all test cycles into consecutive addresses of a random access memory 30. During the test, a counter 32 clocked by the period clock signal PCLK increments its output count at the start of each test cycle. The output count read addresses memory 30 and the PCLK read enables memory 30 so that it reads out a next vector at the start of the next test cycle. While this pattern generator architecture is suitable for short IC tests spanning relatively few test cycles, such a pattern generator requires an impractically large memory 30 to store all of the vectors needed for long tests spanning a large number of test cycles.

FIG. 3 illustrates a prior art "algorithmic" pattern generator 16B that also has been used to implement pattern generator 16 of FIG. 1. Pattern generator 16B includes a programmable counter 37 for supplying a sequence of addresses to a memory 34 that not only stores a vector at each address but also stores an instruction with the vector at each address. Thus whenever memory 34 reads out a vector for a particular test cycle, it also reads out an instruction. That instruction tells an instruction processor 36 how to tell counter 37 to generate the memory address of the vector for the next test cycle. In response to various instructions, instruction processor 36 can signal counter 37 to increment its current output address, to keep its output address unchanged, or to load a new address provided by the instruction processor. Instruction processor 36 can, for example, perform repeats, loops and subroutine calls. Since many tests involve highly repetitive activities at the DUT pin, a properly designed instruction set can define a large repetitive vector sequence using much less space in memory 34 to store the instructions than would be required to directly store the vector sequence in memory 30 of pattern generator 16A FIG. 2.

However the inherent address/instruction feedback loop delay of pattern generator 16B limits its operating frequency. The test cycle period can be no shorter than the total time required for an address to travel from counter 37 to memory 34, for memory 34 to read out the vector and instruction at that address, for the instruction to travel back to instruction processor 36, and for instruction processor 36 to process that instruction and signal counter 37 to generate the address for the next cycle, and for counter 37 to update its output address. A major portion of the feedback delay occurs in memory 34, typically a dynamic random access memory (DRAM). A DRAM has a relatively long inherent delay between receiving an input address and reading out a data word stored at that address. In some applications a DRAM's delay can be overcome by implementing memory 44 with a DRAM such as a Fujitsu Model "FCRAM" that can operate in a pipeline fashion; even though it may take for example 5 read cycles after receiving an input address to read out data at that address, such DRAM can accept addresses and read out stored vectors once every read cycle. Alternatively memory 44 can be implemented by interleaved banks of DRAMs that are alternately read accessed. However in pattern generator 16B, where the instruction read out of memory 34 controls the next address to be supplied to memory 34, the pattern generator cannot take advantage of the pipeline capability of memory 34.

We could increase the frequency of operation of the pattern generator 16B of FIG. 3 by implementing memory 34 and instruction processor 36 on the same IC and by using a faster kind of memory, such as an SRAM, to implement memory 34, thereby shortening the feedback delay. However placing memory 34 on the same IC as processor 36 and counter 37 and using a fast SRAM to implement memory 34 is not practical or economical for general purpose testers requiring a very large memory 34 to hold all the instructions and vectors needed for a test.

FIG. 4 illustrates a prior art pattern generator 16C providing a fast cache memory 38 on the same IC 40 as an instruction processor 42. (See for example U.S. Pat. No. 6,009,540 issued Dec. 28, 1999 to Kuglin et al, incorporated herein by reference.) All of the test instructions and vectors are stored in a large external DRAM memory 44, similar to memory 34 of FIG. 3. During a test, instruction processor 42 loads instructions and vectors read out of memory 44 into cache memory 38, making use of the pipeline capability of memory 44 to load vectors and instructions into the cache memory at high speed. In the meantime, instruction processor 42 reads an instruction and a vector out of cache memory 38 at the start of each test cycle, provides the vector as the pattern generator output and executes the instruction to determine how to produce an address for the next test cycle.

Since cache memory 38 need not store all of the vectors and instructions for a test, it can be relatively small, and since cache memory 38 resides in the same IC 40 as instruction processor 42 and can be, for example and SRAM, much faster than a DRAM, it can read out an instruction in response to an input address with much less delay than a typical DRAM. Since the address/instruction/address feedback loop is relatively short, it can operate at a much higher frequency than pattern generator 16B of FIG. 3.

However pattern generator 16C of FIG. 4 has drawbacks not shared by pattern generator 16B of FIG. 3. When instruction processor 42 encounters a subroutine call instruction, the called subroutine already must be in cache memory 38 so that instruction processor 42 can immediately jump to the subroutine for the next test cycle. In pattern generator 16C, subroutine calls and loops are limited to the instructions that are currently stored in cache memory 38. For this reason, subroutines that are needed during a test are normally pre-loaded into cache memory 38 before the start of the test and kept there at all times. Since cache memory 38 is relatively small, pattern generator 16C can only execute a relatively limited number of subroutines of relatively limited size.

Also, pattern generator 16C can only handle instruction loops of a relatively limited size. When instruction processor 42 reaches the end of an instruction loop, it must immediately jump back to the start of the loop before the next test cycle. To do that the start or the instruction loop must already reside in cache memory 38; the program cannot jump to an instruction stored only in main memory 44. Thus both the loop start and the loop end instructions (and therefore every instruction of the loop therebetween) must reside within cache memory 38 at the time the loop end instruction is encountered. Accordingly each instruction loop is limited to the number of instructions that cache memory 38 can store. This can prevent programs from efficiently defining large, highly repetitive vector patterns or complex patterns best represented by several nested instruction loops.

Therefore what is needed is an algorithmic pattern or vector generator that can operate as quickly as pattern generator 16C of FIG. 4, and which can make use a large inexpensive external DRAM to store vectors, but which does not have the limitations on use of subroutines and loops that result from the use of a small cache memory.

BRIEF SUMMARY OF THE INVENTION

An algorithmic pattern generator in accordance with the invention generates an output vector on each pulse of a reference clock signal. In accordance with a first aspect of the invention, the pattern generator includes an address counter and a vector memory. The address counter supplies a sequence of addresses to the vector memory, one address per pulse of the reference clock signal. The vector memory stores a vector and an accompanying repeat number at each of address and reads them out when addressed by the address counter.

In accordance a second aspect of the invention, the pattern generator also includes a repeat processor that loads each address and its accompanying vector number read out of the vector memory into a first-in/first out (FIFO) buffer, thereafter shifts each vector/repeat number pair out of the FIFO buffer, and then supplies an instance of the vector as the pattern generator output vector on each of each of N consecutive clock signal pulses, where N is the value of the vector's accompanying repeat number.

In accordance with a third aspect of the invention, the pattern generator includes an instruction processor read accessing an instruction memory implemented on the same IC. The instruction memory stores a set of algorithmic instructions, each telling instruction processor how to address the instruction memory so that it reads out a next instruction to be executed.

In accordance with a fourth aspect of the invention, each instruction also includes a starting vector memory address and a cycle count number of value M. When the instruction processor reads an executes an instruction stored in the instruction memory, it signals the address counter to supply the vector memory start address included in the instruction as the vector memory address input to the vector memory, and to thereafter increment the vector memory input address on each of the next M reference clock signal pulses. The instruction processor reads and executes a next instruction out of the instruction memory M clock signal cycles later.

In accordance with a fifth aspect of the invention, whenever the repeat processor supplies a vector as the pattern generator output for N consecutive clock signal cycles, where N is the value of its accompanying repeat number, the repeat processor inhibits the address counter from incrementing its output address and refrains from shifting the vector memory output into the FIFO buffer for N−1 consecutive clock signal cycles.

With the instruction memory being a small, high-speed memory embedded on the same IC as the instruction process, the instruction processor can read access and execute instructions very rapidly. Since there is no feedback between the vector memory and the instruction processor, the vector memory address-to-vector output delay does not limit the rate at which the instruction processor can read access the instruction memory and execute instructions. Also, since it is not necessary for the processor to receive an instruction output of the vector memory in order to determine the vector memory address, the vector memory can be operated in a pipeline mode in which the interval between reference clock signal pulses is much shorter than the delay between application of an input address to the vector memory and read out of a vector at that address. This enables the pattern generator to produce vectors at a maximum frequency of operation.

It is accordingly an object of the invention to provide a high-speed algorithmic pattern generator.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form a typical prior art integrated circuit (IC) tester, FIGS. 2–4 illustrate in more detailed block diagram three alternative prior art versions of the pattern generator of the IC tester of FIG. 1, and FIG. 5 illustrate in block diagram form a pattern generator in accordance with the present invention.

DETAILED DESCRIPTION OF THE INVENTION

Pattern Generator Architecture

FIG. 5 illustrates an algorithmic pattern generator 50 for generating an output vector on each pulse of an input clock signal PCLK. Pattern generator 50 can, for example, replace a conventional pattern generator 16 controlling test activities of prior art integrated circuit (IC) tester 10 of FIG. 1. Pattern generator 50 of FIG. 4 can produce output vectors at the same high rate as prior art pattern generator 16C of FIG. 4, given memories and processors of similar speed. However since pattern generator 50 does not employ a cache memory, the size and number of its subroutines and larger instruction loops pattern generator 50 can execute are not limited by the number of instructions that it can concurrently store in a cache memory.

Pattern generator 50 includes a vector memory 52 for storing the vectors needed for the test and an address counter 54 for supplying a sequence of vector memory addresses VADDR to the vector memory. During a test address counter 54 supplies a sequence of addresses to vector memory 52, one on each pulse of the PCLK signal. Vector memory 52 responds by reading out a sequence of vectors, one on each pulse of the PCLK signal. Vector memory 52 also stores and reads out a "repeat" number with each vector. Vector memory 52 is suitably a dynamic random access memory (DRAM). Some conventional DRAMs are relatively slow, vector memory 52 is preferably implemented by a DRAM such as a Fujitsu Model "FCRAM" which can operate in a pipeline fashion. Although it may take several read cycles for such a DRAM to produce an output vector in response to an input address, using pipeline techniques that type of DRAM can receive an input address and generate an output vector once each read cycle. Such DRAMs are often employed in server applications. Vector memory 52 may be alternately implemented by interleaved banks of conventional DRAMs.

Pattern generator 50 also includes a "repeat processor" 58 including a state machine 59 clocked by the PCLK signal, a first-in, first-out (FIFO) buffer 60 controlled by the state machine and an output register 62 clocked by the PCLK signal. State machine 59 shifts vectors and accompanying repeat numbers read out of vector memory through FIFO buffer 60. The repeat number shifted out of FIFO buffer 60 provides an input to state machine 59 while the accompanying vector is supplied as input to output register 62. The vector stored in output register 62 during any given PCLK signal cycles becomes the vector output of pattern generator 50. The repeat number (of value N) accompanying each vector output of vector memory 52 tells state machine 59 the number N of successive PCLK cycles for which repeat processor 58 is to refrain from shifting a next vector/repeat number pair out of FIFO buffer 60. Thus each vector shifted out of FIFO buffer 60 stays in register 62 for N PCLK signal cycles. Thus vector processor 58 "appends" each vector output of FIFO buffer 60 to the pattern generator's output data sequence for N PCLK cycles, where N is the value of the vector's accompanying repeat number.

Note that while address counter 54 supplies an address to vector memory 52 on each pulse of the PCLK signal, and while vector memory 52 reads a vector out on each pulse of the PCLK signal, repeat processor 58 provides some of those vectors as the pattern generator output for more than one consecutive PCLK signal cycles. Thus when repeat numbers are greater than one, vector memory 52 supplies vector/repeat number pairs to FIFO buffer 60 faster than state machine 59 shifts them out of the FIFO buffer. Hence when state machine 59 temporarily halts shifting vectors out of FIFO buffer 60 in response to a repeat number of value N greater than one, it also transmits an INHIBIT signal to address counter 54 telling it to refrain from incrementing its output address VADDR for the number (N−1) of PCLK cycles in which the current output vector is being repeated. Shortly thereafter, when vector memory 52 has had a sufficient number of PCLK cycles to produce an output vector/repeat number pair in response to the last address produced by address counter 54 before it was inhibited, state machine 59 also stops shifting vectors and repeat numbers into FIFO buffer 60 for N−1 PCLK cycles. Upon the Nth repetition of the output vector, state machine 59 shifts a next vector/repeat number pair out of FIFO buffer 60 and signals address counter 54 to resume incrementing its output address. Thereafter, when vector memory 52 as had a sufficient number of PCLK cycles to produce an output vector number pair in response to the incremented address, state machine 59 resumes shifting the vector memory output into FIFO buffer 60. Thus where vector memory 52 has an inherent delay of K PCLK signal cycles between its address input and vector/repeat number output, FIFO buffer 60 must include at least K buffer stages.

Pattern generator 50 also includes a high speed instruction memory 64 (suitably an SRAM), and an instruction processor 68, preferably implemented on the same integrated circuit (IC) chip 70. When instruction processor 58 supplies an address IADDR to instruction memory 64, the instruction memory reads out an instruction at that address. Each instruction read out of instruction memory 64 has four fields. The first two of those fields (OPCODE and OPERAND) tell instruction processor 68 how to update the instruction memory address to obtain a next instruction. The OPCODE instruction field indicates an algorithmic instruction type such as increment, branch, call, return, loop start or loop end. The OPERAND field conveys information relative to the opcode. For example the operand may convey a branch address, a loop count, a loop return address or a subroutine start address. A third field ("CYCLES") of the instruction read out of instruction memory 64 indicates a number of PCLK signal cycles that instruction processor 68 is to wait before reading accessing and executing the next instruction. The fourth field of each instruction read out of instruction memory 64 is a "START" field indicating a starting address within vector memory 52 of a sequence of vectors to be read out of vector memory 52.

An external host computer (not shown) programs pattern generator 70 by writing instructions into instruction memory 64 and by writing vectors and repeat numbers into vector memory 52 through conventional memory interfaces (not shown). The host computer then transmits a BEGIN signal to instruction processor 68 telling instruction processor 68 to read and execute the instruction stored at the first address of instruction memory 64 on the next PCLK signal pulse.

Address counter 54 receives the START address included in the instruction read out of instruction memory 64, and instruction processor 68 immediately transmits a LOAD control signal to the address counter telling it to load that START address and to supply it as the input address (VADDR) to vector memory 52 on a next PCLK cycle. On each PCLK cycle thereafter, instruction processor 68 transmits an INC pulse to counter 54 telling it to increment its output address VADDR. Instruction processor 68 also transmits a READ signal on each pulse of the PCLK signal to vector memory 52 telling it to read out the data stored at its current address.

After counting the number of PCLK signal cycles indicated by the CYCLE field of the currently executed instruction, instruction processor 68 updates the instruction memory address (IADDR) in a manner determined by the last instruction's OPCODE and APPEND fields, and then transmits a READ signal to instruction memory 64 causing it to read out the next instruction to be executed. Instruction processor 68 then loads the next START address into address counter 54 and begins pulsing the INC signal to increment address output of address counter for the number of cycles indicated by the CYCLE field. Instruction processor 68 repeats this process until it reaches an end of program instruction.

In the meantime vector memory 52 reads out a vector/repeat number pair referenced by its current input address VADDR in response to each pulse of the READ signal from instruction processor 68. Vector memory 52 operates in a pipeline fashion so even though the vector/repeat number pair addressed by the current VADDR input may require several (for example five) PCLK signal cycles to emerge from the vector memory, when counter 54 addresses vector memory 52 at the high PCLK signal frequency, vector memory 52 will read out vectors at that high frequency.

As discussed above, state machine 59 normally shifts vector/repeat number pairs read out of vector memory 52 through FIFO buffer 60 at the same PCLK signal frequency, although it temporally halts that process for N−1 PCLK cycles when an output vector's accompanying repeat number has a value N greater than 1. In doing so state machine 59 inhibits counter 54 from incrementing VADDR for N−1 cycles despite the occurrence of INC control signal pulses from instruction processor 68. Thus the value M of the CYCLES data in each instruction stored in instruction memory 64 should be set equal to the sum of values of the repeat numbers accompanying all of the vectors that are to be read out of vector memory 52 in response to that instruction.

For example, suppose we want vector memory 52 to read out vectors at ten successive vector memory addresses starting at address 3001 (decimal) and ending at address 3010. Suppose that nine out of ten of those instructions have repeat numbers N=1 and one of those instructions has a repeat number of N=32. That means that the vectors read out of 10 successive vector memory 52 will define a sequence of 41 (32+9) pattern generator output vectors. Therefore, while we want address counter to increment its output address 9 times after receiving a START address, we want instruction processor to wait 41 PCLK cycles before executing another instruction. Accordingly, the START address field of the instruction read out of instruction memory 64 should be set to 3001, and the CYCLES field should be set to M=41.

Note that instruction processor 68 does not receive any feedback from any device external to IC 70. In particular it does not have to look at any output of vector memory 52 produced in response to a last vector memory address before it can determine how to set the next vector memory addresses. Thus unlike prior art pattern generator 16B of FIG. 3, pattern generator 50 can operate very quickly even when vector memory 52 is distant from the instruction process 68. There is no feedback path between the vector memory and the instruction processor; vector memory 52 does not read out instructions for the instruction processor. Since instruction memory 64 need only store a relatively small number of instructions and does not store any vectors, it can be a relatively fast SRAM that is practical to embed in the same IC 70 as instruction processor 68, even when it defines a very large output vector sequence. Since the instruction feedback loop through instruction memory 64 has a very short delay, instruction processor 68 can read and execute algorithmic instructions at a much higher frequency the instruction processor 36 of prior art pattern generator 16B (FIG. 3). Since it is not a part of the instruction feedback loop, the conventional DRAM vector memory 52 can read out vectors at a high PCLK frequency even though vector memory may need several PCLK cycles to read out a vector/repeat number in response to each input address VADDR.

Prior art generator 16C of FIG. 4 also includes a memory 38 embedded on the same IC 40 as an instruction processor 42. But memory 38 is a cache memory that stores both instructions and vectors read out of the main memory 44. While the fast, local cache memory 38 allows instruction processor 42 to read out and execute instructions and produce output vectors at a high PCLK signal frequency, instruction processor 42 cannot jump to any instruction in the program stored in memory 44; it can only jump to instructions that currently reside in cache memory 38. The use of cache memory 38 therefore limits the size and number of loops and subroutines that the program can employ and makes programming somewhat difficult. In contrast, since the entire program for pattern generator 50 resides in the embedded instruction memory 64, pattern generator 50 has no similar restrictions on program loops and subroutines.

Instruction Set

As discussed above, all instructions include START and CYCLES fields. The following lists a suitable OPCODE/operand instruction set for instruction processor 68 that can be used to form an algorithmic program stored in instruction memory 64.

INCREMENT

The increment opcode tells instruction processor to signal increment the instruction memory address.

Call N

The call opcode tells instruction processor 68 to jump to a subroutine address referenced by the operand field, to increment the current instruction memory address, and to push the result onto an internal call stack register.

Return

The return opcode tells instruction processor 68 to return from a subroutine call by popping a last address off its internal call stack register and supplying it as the IADDR input to instruction memory 64.

LoopStart L

The LoopStart opcode signifies the start of an instruction loop and its accompanying operand indicates the number L times the loop is to be repeated. Instruction processor responds by loading L into an internal loop counter.

LoopEnd

The LoopEnd opcode tells instruction processor 68 to decrement its internal loop counter and, if the loop counter output has not reached zero, to return to a loopstart address included in the accompanying operand.

Repeat R

The repeat opcode tells instruction processor 68 to repeat the same instruction R times, where R is the value of its accompanying opcode.

Branch B

The branch opcode tells the instruction processor to branch to an address B referenced in its accompanying operand.

BranchOnFail F

A branch on fail opcode tells instruction processor 28 to branch to an address F indicated in its accompanying operand if at any time during the instruction cycle a device under test FAIL signal interrupt input to instruction processor 68 is asserted. Otherwise the processor treats the branch on fail instruction as an increment instruction. Thus when pattern generator 50 replaces pattern generator 16 of the tester of FIG. 1, the FAIL signal output of formatter 22 may be routed to pattern generator 16 as well as to host computer 18.

End

The END instruction tells instruction processor 68 to terminate program execution and await a START signal pulse.

Thus has been shown and described a high speed algorithmic pattern generator 50 suitable for use in an IC tester. Pattern generator 50 can operate at a high speed because all instructions are contained in an instruction memory 64 embedded on the same IC 70 as instruction processor 68 so that address/instruction feedback loop is short and fast. Pattern generator 50 makes efficient use of high speed memory space by placing all of the vectors in an external vector memory 52, by restricting the size of the instruction set to minimize the width of instruction opcodes by storing repeat numbers in the vector memory and providing a separate repeat instruction processor 58 to implement the vector repeats.

While the forgoing specification has described preferred embodiment(s) of the present invention, one skilled in the art may make many modifications to the preferred embodiment without departing from the invention in its broader aspects. For example while pattern generator 50 may be used for generating vectors for controlling operation of an integrated circuit tester channel, a vector as the term is used herein is simply a data word that may be used for any purpose. Hence pattern generator 50 may be employed in any application in which a particular pattern of data words is required, with data words arriving at regular intervals. The appended claims therefore are intended to cover all such modifications as fall within the true scope and spirit of the invention.

What is claimed is:

1. An apparatus for generating an output vector sequence, the apparatus comprising:
   a vector memory for storing a vector and an accompanying repeat number at each of a plurality of addressable storage locations and for reading out each vector and its accompanying repeat number when addressed by an address of a first address sequence;
   an address counter for producing and supplying said first address sequence to said vector memory;
   an instruction memory for storing and reading out an instruction sequence in response to a second address sequence supplied as input thereto;
   an instruction processor for responding to the instruction sequence by generating the second address sequence and by transmitting control signals to the address counter causing it to produce the first address sequence; and
   a repeat processor for generating the output vector sequence, wherein in response to each vector and its accompanying repeat number read out of the vector memory, the repeat processor appends N instances of the vector to the output vector sequence, where N is an integer value of its accompanying repeat number.

2. The apparatus in accordance with claim 1 wherein said instruction memory and said instruction processor are implemented together on a single integrated circuit.

3. The apparatus in accordance with claim 2 wherein said vector memory is external to said integrated circuit.

4. The apparatus in accordance with claim 1 wherein said repeat processor comprises:
   buffer means for receiving and storing each vector and its accompanying repeat number read out of the vector memory; and
   control means for reading each vector and its accompanying repeat number out of the buffer means and for appending N instances of the vector to the output vector sequence, where N is an integer value of its accompanying repeat number.

5. The apparatus in accordance with claim 4 wherein said buffer means comprises a first-in, first out (FIFO) buffer.

6. The apparatus in accordance with claim 4 wherein the repeat numbers said control means reads out of said buffer means have values ranging from one to a number greater than one,
   wherein said control means transmits an inhibit signal to said address counter when any one of said repeat numbers has a value greater than one, and
   wherein said inhibit signal inhibits the address counter from responding to the control signals transmitted by said instruction processor.

7. The apparatus in accordance with claim 1 wherein each instruction of the instruction sequence read out of said instruction memory, other than a last instruction of said instruction sequence, tells the instruction processor how to determine a next address of said second address sequence.

8. The apparatus in accordance with claim 7
   wherein said instruction processor has an input signal (FAIL), and
   wherein at least one instruction of said instruction sequence references a particular instruction memory address and tells the instruction processor to branch to that particular instruction memory address to obtain a next instruction to be executed when the input signal is asserted, and to otherwise increment a current instruction memory address to obtain a next instruction to be executed when the input signal is not asserted.

9. The apparatus in accordance with claim 8 wherein when appending N instances of each vector to the output sequence, the repeat processor inhibits the address counter from incrementing its output address for N-1 clock signal cycles.

10. The apparatus in accordance with claim 1
    wherein at least one instruction of the instruction sequence includes a start address supplied as input to said address counter, and
    wherein upon executing said at least one instruction, the instruction processor signals the address counter to produce the start address as an address of the first address sequence.

11. The apparatus in accordance with claim 10
    wherein said at least one instruction also includes an integer cycle number indicating a number of times said instruction processor is to transmit an increment signal pulse to said address counter, and wherein each said increment signal pulse tells the in address counter to produce an address of said first address sequence by incrementing a preceding address of said first address sequence.

12. The apparatus in accordance with claim 11 wherein said repeat processor comprises:

buffer means for receiving and storing each vector and its accompanying repeat number read out of the vector memory; and control means for reading each vector and its accompanying repeat number out of the buffer means and for appending N instances of the vector to the output vector sequence, where N is an integer value of its accompanying repeat number, wherein the repeat numbers said control means reads out of said buffer means have values ranging from one to a number greater than one, wherein said control means transmits an inhibit signal to said address counter when any one of said repeat numbers has a value greater than one, and wherein said inhibit signal inhibits the address counter from responding to a portion of the increment signal pulses transmitted by said instruction processor.

13. The apparatus in accordance with claim 1 wherein each instruction of the instruction sequence, other than a last instruction of the instruction sequence, includes a start address supplied as input to said address counter and includes a cycle count number, wherein upon executing said at least one instruction, the instruction processor signals the address counter to produce the start address as an address of the first address sequence and transmits a number of increment signal pulses to said address counter equal to said cycle count number, wherein each increment signal pulse tells the address counter to produce an address of said first address sequence by incrementing a preceding address of said first address sequence, wherein said repeat processor comprises:

buffer means for receiving and storing each vector and its accompanying repeat number read out of the vector memory; and control means for reading each vector and its accompanying repeat number out of the buffer means and for appending N instances of the vector to the output vector sequence, where N is an integer value of its accompanying repeat number, wherein said control means transmits an inhibit signal to said address counter when any one of said repeat numbers has a value greater than one, and wherein said inhibit signal inhibits the address counter from responding to a portion of the increment signal pulses transmitted by said instruction processor.

14. The apparatus in accordance with claim 1 wherein said instruction sequence read out of the instruction memory includes a loop start instruction and a loop end instruction, wherein the loop start instruction indicates a starting address in said instruction memory of a sequence of instructions to be repeated; and wherein the loop end instruction indicates an ending address in said instruction memory of the sequence of instructions to be repeatedly executed by said instruction processor.

15. The apparatus in accordance with claim 1 wherein said instruction sequence read out of the instruction memory includes a subroutine call instruction referencing an address in said instruction memory of a subroutine of instructions to be read out of said instruction memory and executed by said instruction processor.

16. The apparatus in accordance with claim 1 wherein at least one instruction of the instruction sequence includes a start address supplied as input to said address counter, wherein upon executing said at least one instruction, the instruction processor signals the address counter to produce the start address as an address of the first address sequence, wherein said at least one instruction also includes an integer cycle number indicating a number of times said instruction processor is to transmit an increment signal pulse to said address counter, wherein each said increment signal pulse tells the in address counter to produce an address of said first address sequence by incrementing a preceding address of said first address sequence, wherein the repeat numbers said control means reads out of said buffer means have values ranging from one to a number greater than one, wherein said control means transmits an inhibit signal to said address counter when any one of said repeat numbers has a value greater than one, and wherein said inhibit signal inhibits the address counter from responding to a portion of the increment signal pulses transmitted by said instruction processor.

17. An apparatus for generating an output vector sequence, the apparatus comprising:

a vector memory for storing a vector and an accompanying repeat number at each of a plurality of addressable storage locations and for reading out each vector and its accompanying repeat number when addressed by an address of a first address sequence;

an address counter for producing and supplying said first address sequence to said vector memory;

an instruction memory for storing and reading out an instruction sequence in response to a second address sequence supplied as input thereto;

an instruction processor for responding to the instruction sequence by generating the second address sequence and by transmitting control signals to the address counter causing it to produce the first address sequence, wherein each instruction of the instruction sequence read out of said instruction memory, other than a last instruction of said instruction sequence, tells the instruction processor how to determine a next address of said second address sequence;

buffer means for receiving and storing each vector and its accompanying repeat number read out of the vector memory; and control means for reading each vector and its accompanying repeat number out of the buffer means and for appending N instances of the vector to the output vector sequence, where N is an integer value of its accompanying repeat number ranging from one to a number greater than one, and for inhibiting signal inhibits the address counter from responding to the control signals transmitted by said instruction processor.

18. The apparatus in accordance with claim 17 wherein said instruction memory and said instruction processor are implemented together on a single integrated circuit and said vector memory and said address counter are external to said integrated circuit.

* * * * *